(12) United States Patent
Lee

(10) Patent No.: US 7,361,583 B2
(45) Date of Patent: Apr. 22, 2008

(54) RF SEMICONDUCTOR DEVICES AND METHODS FOR FABRICATING THE SAME

(75) Inventor: Yong Guen Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 47 days.

(21) Appl. No.: 10/627,057

(22) Filed: Jul. 25, 2003

(65) Prior Publication Data

US 2004/0067610 A1    Apr. 8, 2004

(30) Foreign Application Priority Data

Jul. 26, 2002   (KR) ...................... 10-2002-0044084

(51) Int. Cl.
*H01L 21/28*    (2006.01)
*H01L 21/4763*  (2006.01)

(52) U.S. Cl. ...................... 438/622; 438/672

(58) Field of Classification Search ................ 438/197, 438/586, 587, 618, 620, 624, 629, 637, 652, 438/672, 675, 622, 631, 700; 257/288, 329
See application file for complete search history.

(56) References Cited

U.S. PATENT DOCUMENTS

| | | | | |
|---|---|---|---|---|
| 5,939,753 A * | 8/1999 | Ma et al. | .................... | 257/339 |
| 6,048,772 A * | 4/2000 | D'Anna | ...................... | 438/301 |
| 6,177,320 B1 * | 1/2001 | Cho et al. | .................... | 438/279 |
| 6,204,161 B1 * | 3/2001 | Chung et al. | ............... | 438/612 |
| 6,294,834 B1 * | 9/2001 | Yeh et al. | .................... | 257/758 |
| 6,363,658 B1 * | 4/2002 | Lai | ............... | 47/79 |
| 6,376,351 B1 * | 4/2002 | Tsai | ........................... | 438/592 |
| 6,444,517 B1 * | 9/2002 | Hsu et al. | .................... | 438/238 |
| 6,445,026 B1 * | 9/2002 | Kubota et al. | ............. | 257/296 |
| 6,452,249 B1 * | 9/2002 | Maeda et al. | ............... | 257/531 |
| 6,489,217 B1 * | 12/2002 | Kalnitsky et al. | ........... | 438/409 |
| 6,511,919 B1 * | 1/2003 | Park et al. | ................... | 438/723 |
| 6,528,848 B1 * | 3/2003 | Hoshino et al. | ............ | 257/339 |
| 6,537,849 B1 * | 3/2003 | Tsai et al. | .................... | 438/106 |
| 6,642,555 B1 * | 11/2003 | Ishida | ........................ | 257/202 |
| 6,777,343 B2 * | 8/2004 | Park et al. | ................... | 438/723 |
| 2002/0155655 A1 * | 10/2002 | Pon | ............................ | 438/238 |
| 2003/0003700 A1 * | 1/2003 | Cho et al. | ................... | 438/585 |
| 2003/0022514 A1 * | 1/2003 | Park et al. | ................... | 438/723 |
| 2003/0199155 A9 * | 10/2003 | Cho et al. | ................... | 438/585 |
| 2004/0100814 A1 * | 5/2004 | Hsu | .......................... | 365/148 |
| 2006/0018161 A1 * | 1/2006 | Chen et al. | ............ | 365/185.28 |
| 2006/0120138 A1 * | 6/2006 | Liaw et al. | ................. | 365/149 |
| 2006/0231903 A1 * | 10/2006 | Lee et al. | ................... | 257/377 |
| 2007/0013024 A1 * | 1/2007 | Kutsukake et al. | ......... | 257/510 |

* cited by examiner

*Primary Examiner*—M. Wilczewski
(74) *Attorney, Agent, or Firm*—Andrew D. Forteny

(57) ABSTRACT

RF semiconductor devices and methods of making the same are disclosed. In a disclosed method, a trench for defining an active region and an element isolation region is formed in a semiconductor substrate. One or more gate lines is then formed within the active region. Next, an insulating layer is formed on the semiconductor substrate and the gate lines. Contact holes are then formed in the insulating layer. Contact plugs are then formed in the contact holes. Thereafter, a conductive pattern is electrically connected with the contact plugs.

18 Claims, 4 Drawing Sheets

RF SEMICONDUCTOR DEVICES AND METHODS FOR FABRICATING THE SAME

FIELD OF THE DISCLOSURE

The present disclosure relates generally to semiconductor devices; and, more particularly, to radio frequency (RF) semiconductor devices having decreased parasitic capacitance and gate resistance and methods for fabricating the same.

BACKGROUND

Transistors, inductors, capacitors and varactors are widely used radio frequency (RF) semiconductor devices. Recently, silicon has become widely used in fabricating RF semiconductor devices for the purpose of reducing manufacturing costs. However, when an RF semiconductor device is made of silicon, certain characteristics thereof may be deteriorated.

For example, if a transistor, e.g., a MOSFET, is used in an RF circuit operating at high frequency, it is necessary to increase an operating frequency (Ft, Fmax) of the transistor. Factors effecting the operating frequency of MOSFETs include the parasitic capacitance between the gate and the substrate of the MOSFET, the resistance of the gate line, and the like. If the RF MOSFET is produced in a semiconductor manufacturing process, since a greater current, that is, a large transconductance gm of the RF MOSFET is required, the gate width thereof must be enlarged.

A prior art method for manufacturing a conventional RF semiconductor device will now be described with reference to the accompanying drawings. FIG. 1 shows a top plan view of a conventional RF semiconductor device. FIGS. 2A and 2B are cross-sectional views of the conventional RF semiconductor device taken along lines X-X' and Y-Y' shown in FIG. 1, respectively.

Referring to FIG. 1, a gate line 15 is formed on an active region 10 in a longitudinally elongated zigzag shape. A plurality of contact holes 19 are formed between the zigzags of the gate line 15. The contact holes are formed at a constant distance from one another. A portion of the gate line 15, as shown in FIG. 1, is formed over an inactive region, i.e., an element isolation region. Some of the contact holes 19 are also formed on the gate line 15 within the element isolation region.

As shown in FIG. 2A, a trench 13 is formed in a semiconductor substrate 11 and then the gate line 15 is formed on the semiconductor substrate 11. Next, an insulating layer 17 is formed on the semiconductor substrate 11 having the gate line 15 thereon. The insulating layer 17 is then selectively patterned to thereby form the contact holes 19 which expose the semiconductor substrate 11 and the gate line 15. Next, a first conductive material is deposited on the insulating layer 17 and in the contact holes 19. The first conductive material is then planarized to thereby form contact plugs 21.

Next, a second conductive material is deposited on the insulating layer 17 and the contact plugs 21. The second conductive material is then selectively patterned to thereby form a conductive pattern 23 in contact with the contact plugs 21.

Meanwhile, as shown in FIG. 2B, the gate line 15 is also formed over the trench 13 beyond the active region 10.

Most conventional RF MOSFETs employ a gate having a large width. In such a case, a fringe of the gate line 15 is extended for contact to the element isolation region as shown in FIGS. 1 and 2A.

Also, in the above construction, since the trench 13 and the gate line 15 are overlapped with each other in a plurality of places, the parasitic capacitance Cgb between the gate line 15 and the trench 13 is increased as indicated at C in FIGS. 2A and 2B.

Because the operating frequency Ft, which is one of the important parameters of the RF MOSFET, has a functional relationship with the parasitic capacitance Cgb, an increase in the parasitic capacitance Cgb can adversely affect the operating frequency Ft. Specifically, if several (e.g., dozens) of gate fingers are used in order to enlarge the width of the gate line 15, the parasitic capacitance Cgb will be further increased.

DETAILED DESCRIPTION

Figure 1:
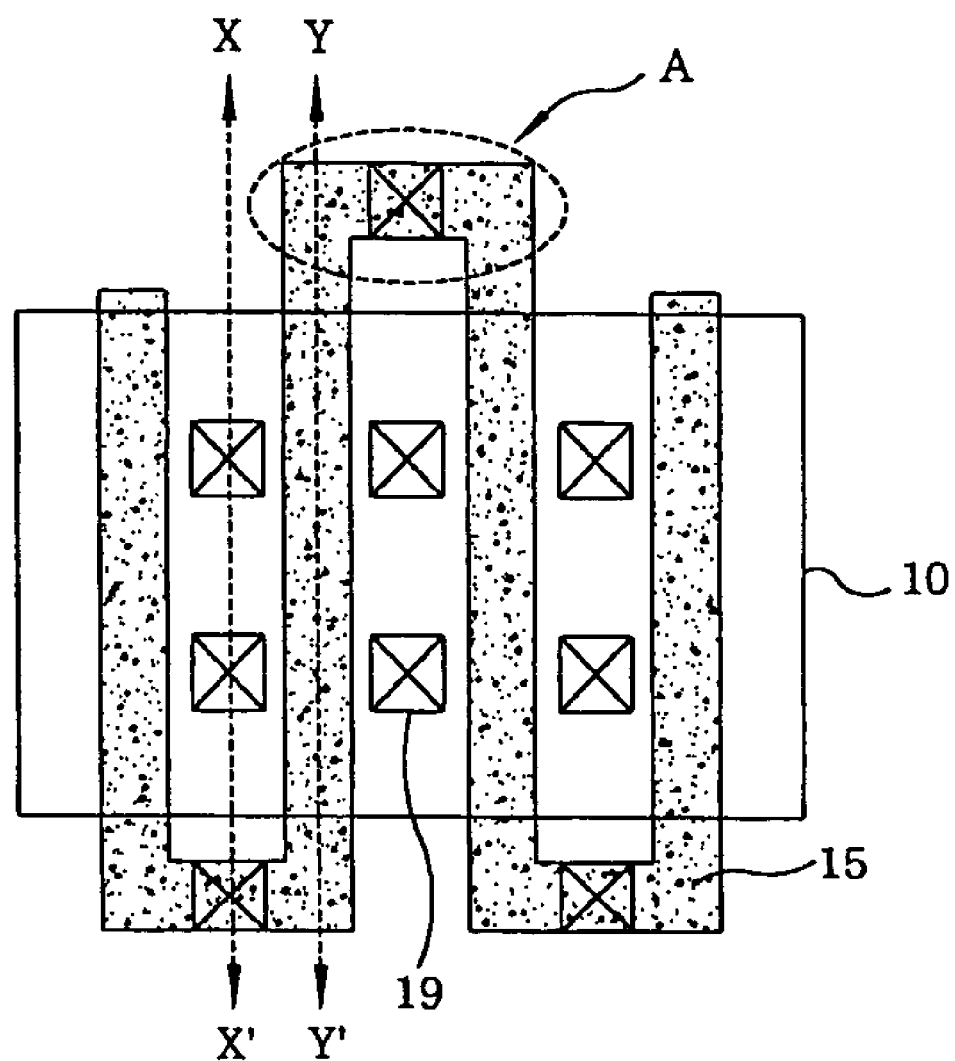
FIG. 1 is a top plan view of a conventional RF semiconductor device.
Figure 2A:
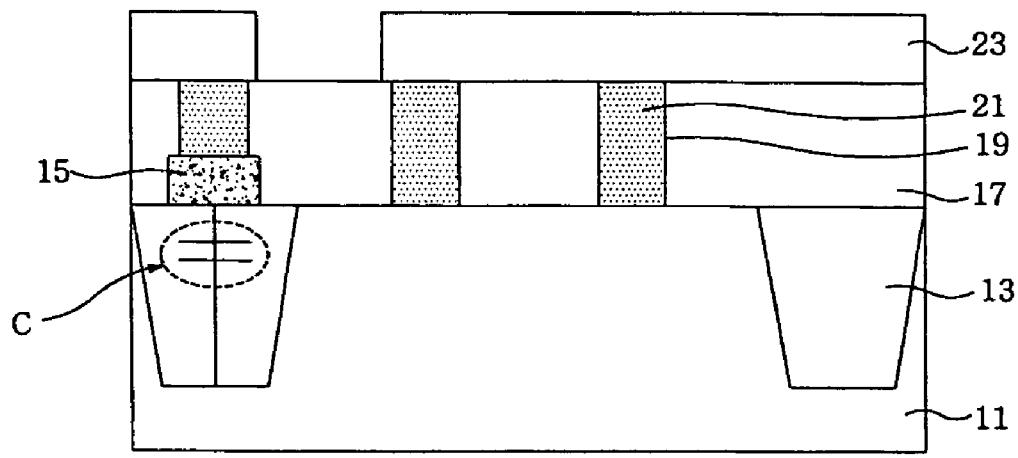
FIGS. 2A and 2B are cross-sectional views of the conventional RF semiconductor device of FIG. 1 taken along lines X-X' and Y-Y', respectively.
Figure 2B:
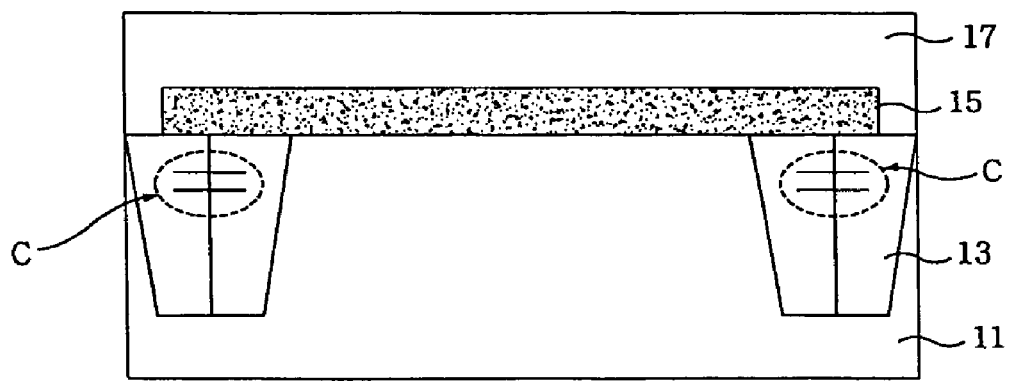
Figure 3:
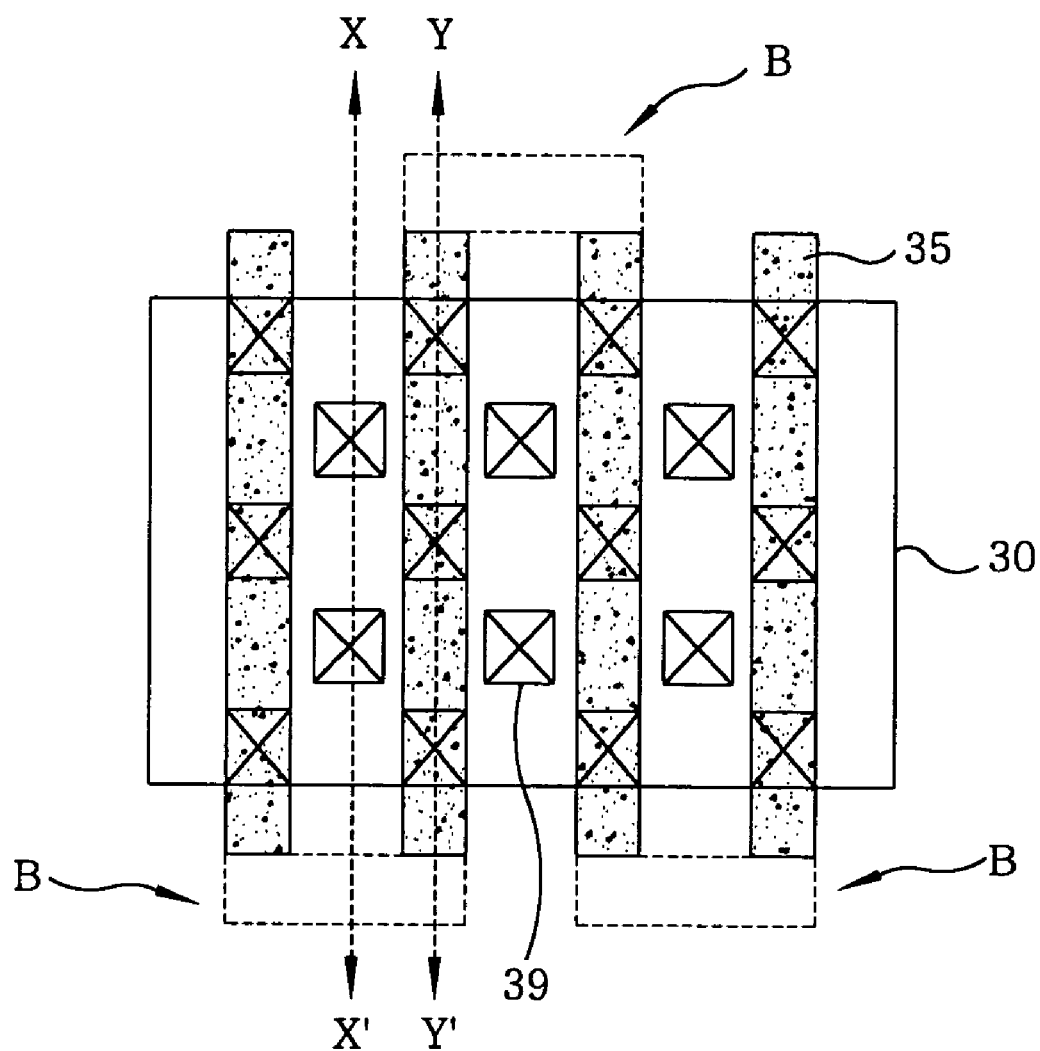
FIG. 3 is a top plan view of an example RF semiconductor device.
Figure 4A:
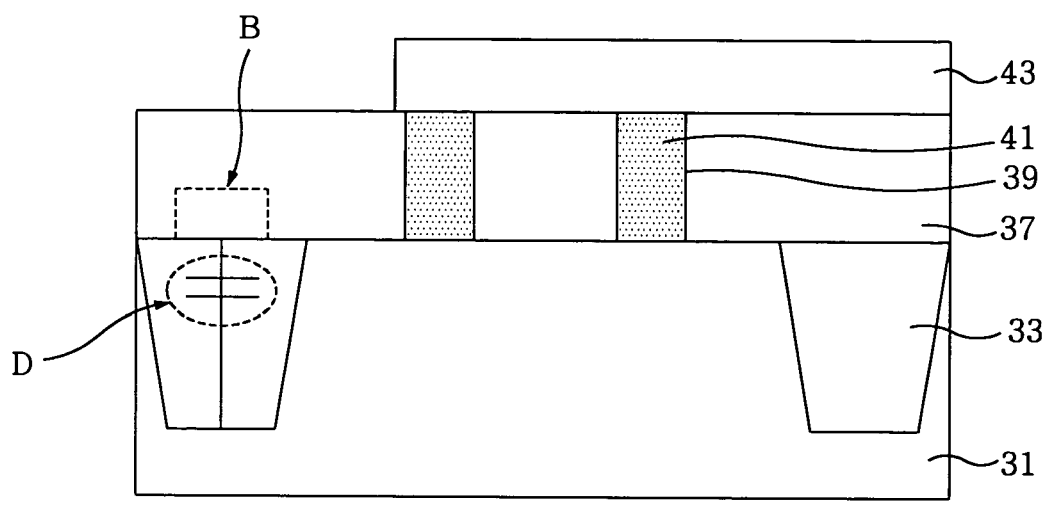
FIGS. 4A and 4B are cross-sectional views of the RF semiconductor device of FIG. 3 taken along lines X-X' and Y-Y', respectively.
Figure 4B:
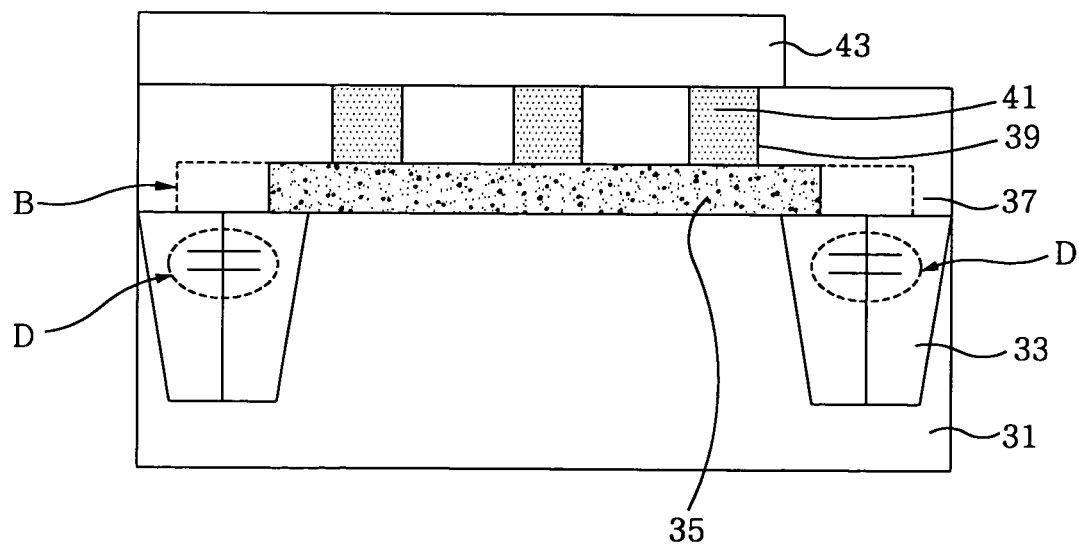

Hereinafter, an example method for fabricating an RF semiconductor device will be described with reference to the accompanying drawings. FIG. 3 is a top plan view of an example RF semiconductor device. FIGS. 4A and 4B are cross-sectional views of the example RF semiconductor device of FIG. 3 taken along lines X-X' and Y-Y', respectively.

Referring to FIG. 3, a plurality of gate lines 35 which are elongated along a longitudinal direction are arranged on an active region 30 of a semiconductor substrate 31. A substantially constant distance is maintained between the gate lines 35. A plurality of contact holes 39 are formed between and on the gate lines 35 as shown in FIG. 3. A substantially constant distance is maintained between the contact holes 39. Specifically, the plurality of contact holes 39 are only formed within the active region 30.

As shown in FIG. 4A, a trench 33 is formed in the semiconductor substrate 31 and then the gate lines 35 are formed on the semiconductor substrate 31. However unlike the conventional gate lines 15 discussed above, the gate lines 35 are not formed to run along a longitudinal axis of the trench 33 as indicated at B of FIG. 4A.

Next, an insulating layer 37 is formed on the semiconductor substrate 31 having the gate lines 35 thereon. The insulating layer 37 is then selectively patterned to thereby form the contact holes 39 which expose the semiconductor substrate 31 and the gate line 35. At this time, the contact holes 39 are only formed within the active region 30.

A first conductive material is then deposited on the insulating layer 37 and in the contact holes 39. The first conductive material is then planarized to thereby form contact plugs 41.

Next, a second conductive material is deposited on the insulating layer 37 and the contact plugs 41. The second conductive material is then selectively patterned to thereby form a conductive pattern 43 contacting the contact plugs 41. As a result, some of the contact holes 39 are formed on the gate lines 35. As mentioned, the gate lines 35 are only formed within the active region 30. The contact holes 39 are filled with the first conductive material and are electrically connected with the conductive pattern 43. The thickness of the insulating layer is formed from about 1000 to about 20000 angstroms. The thickness of the conductive pattern layer 43 is formed to be over 10000 angstroms to maximize efficiency. The insulating layer 37 is oxide formed at low temperature, or a polyimide film.

As described above, the conventional fringe portion of the gate lines 15 which are extended from the active region 10 to the isolation region are removed. Since a gate line finger has one removed fringe portion, if N gate fingers are used, the parasitic capacitance Cgb is decreased by as much as N times relative to the conventional RF MOSFET.

Since the gate lines 35 are not substantially overlapped with the trench(es) 33, the parasitic capacitance between the gate lines 35 and the semiconductor substrate 31 is decreased and the resistance of the gate lines 35 is decreased as well to thereby improve the operating frequency Ft of the semiconductor device.

From the foregoing, persons of ordinary skill in the art will appreciate that methods for fabricating RF semiconductor devices having decreased parasitic capacitance and gate resistance have been disclosed. In a disclosed method, a trench for defining an active region and an element isolation region is formed in a semiconductor substrate. One or more gate lines are formed within the active region in the semiconductor substrate. The gate line(s) do not substantially overlap with the trench. An insulating layer is formed on the semiconductor substrate. A contact hole is formed in the insulating layer. A contact plug is formed in the contact hole. A conductive pattern is then formed that is electrically connected with the contact plug.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for fabricating an RF semiconductor device comprising:

forming a trench to define an active region and an element isolation region in a semiconductor substrate;

forming a plurality of gate lines within the active region of the semiconductor substrate, the plurality of gate lines running perpendicularly to the trench and not extending over a center of the trench;

forming an insulating layer on the plurality of gate lines and the semiconductor substrate;

forming contact holes in the insulating layer over the active region using a single pattern, wherein a first group of the contact holes exposes portions of the gate lines and a second group of the contact holes exposes portions of the substrate in the active region;

forming contact plugs in each of the contact holes; and forming a conductive pattern layer over the insulating layer that is electrically connected with the contact plugs.

2. A method as defined in claim 1, wherein the gate lines are not connected with each other in the element isolation region.

3. A method as defined in claim 1, wherein at least two of the plurality of gate lines are connected in the active region.

4. A method as defined in claim 1, wherein a thickness of the insulating layer is about 1000 to about 20000 angstroms.

5. A method as defined in claim 1, wherein a thickness of the conductive pattern layer is above 10000 angstroms.

6. A method as defined in claim 1, wherein the insulating layer comprises an oxide or a polyimide.

7. A method as defined in claim 1, wherein forming the plurality of gate lines minimizes parasitic capacitance between the plurality of gate lines and the substrate.

8. A method as defined in claim 1, wherein forming the plurality of gate lines minimizes resistance of the plurality of gate lines.

9. A method as defined in claim 1, further comprising metal contacts linking at least two of the plurality of gate lines.

10. A method as defined in claim 1, wherein the plurality of gate lines do not extend along a longitudinal axis of the trench.

11. A method as defined in claim 1, wherein adjacent gate lines are formed at a substantially constant distance along their lengths.

12. A method as defined in claim 1, wherein the second group of contact holes are formed between the plurality of gate lines.

13. A method as defined in claim 1, wherein the element isolation region comprises the trench.

14. A method as defined in claim 1, wherein forming the contact plugs comprises:

forming a first conductive layer over the insulating layer and in the contact holes; and planarizing the first conductive layer.

15. A method as defined in claim 14, wherein planarizing the first conductive layer exposes an upper surface of the insulating layer.

16. A method as defined in claim 1, wherein the insulating layer comprises a low temperature oxide.

17. A method as defined in claim 1, wherein the plurality of gate lines do not extend longitudinally along a longitudinal axis of the trench.

18. A method as defined in claim 1, wherein the plurality of gate lines do not extend horizontally along a longitudinal axis of the trench.

* * * * *